United States Patent
Epmeier et al.

(10) Patent No.: US 11,266,017 B2
(45) Date of Patent: Mar. 1, 2022

(54) SUPPORT FOR LIGHT-EMITTING ELEMENTS AND LIGHTING DEVICE

(71) Applicant: LUMILEDS LLC, San Jose, CA (US)

(72) Inventors: Matthias Epmeier, Aachen (DE); Michael Deckers, Jülich (DE); Frank Giese, Aachen (DE); Petra Wellmeier, Aachen (DE); Carsten Weber, Jülich (DE); Georg Henninger, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/563,516

(22) Filed: Sep. 6, 2019

(65) Prior Publication Data
US 2020/0084889 A1    Mar. 12, 2020

(30) Foreign Application Priority Data
Sep. 7, 2018   (EP) .................................... 18193218

(51) Int. Cl.
*H05K 1/11*       (2006.01)
*H05K 1/02*       (2006.01)
(Continued)

(52) U.S. Cl.
CPC ............ *H05K 1/119* (2013.01); *F21S 41/151* (2018.01); *F21S 41/192* (2018.01);
(Continued)

(58) Field of Classification Search
CPC ...... H05K 1/119; H05K 1/0203; H05K 1/181; H05K 2201/10106; F21S 41/151;
(Continued)

(56) References Cited

U.S. PATENT DOCUMENTS

| 5,910,682 A | * | 6/1999 | Song ................. H01L 25/0657 257/685 |
| 6,220,722 B1 | * | 4/2001 | Begemann .............. F21V 29/67 362/231 |

(Continued)

FOREIGN PATENT DOCUMENTS

| CN | 102840474 A | 12/2012 |
| CN | 107845722 A | 3/2018 |

(Continued)

OTHER PUBLICATIONS

International Search Report dated Sep. 26, 2019 for PCT International Application No. PCT/EP2019/072250.
(Continued)

*Primary Examiner* — Kevin Quarterman
(74) *Attorney, Agent, or Firm* — Volpe Koenig

(57) ABSTRACT

A lighting device, a method of manufacturing a lighting device and a support are described. A support includes a layered structure of alternating conductors and insulating layers. The layered structure includes a mounting section and a body section adjacent the mounting section. The mounting section includes at least one mounting face that has an arrangement direction and at least three alternating contact sections along the arrangement direction. Each contact section is electrically coupled to one of the conductors and separated from a neighboring one of the contact sections by one of the insulating layers. The body section has a width that protrudes sidewards from the at least one mounting face and a length that extends substantially parallel to the arrangement direction.

14 Claims, 7 Drawing Sheets

(51) Int. Cl.
*F21S 41/151* (2018.01)
*F21S 41/19* (2018.01)
*H05K 1/18* (2006.01)

(52) U.S. Cl.
CPC .......... *H05K 1/0203* (2013.01); *H05K 1/181* (2013.01); *H05K 2201/10106* (2013.01)

(58) Field of Classification Search
CPC ..... F21S 41/192; F21S 45/47; F21Y 2107/40; F21Y 2115/10; F21V 29/70; H01L 25/0753; H01L 33/642; H01L 33/62; F21K 9/90; F21K 9/23
See application file for complete search history.

(56) References Cited

U.S. PATENT DOCUMENTS

| | | | | |
|---|---|---|---|---|
| 6,635,987 B1 * | 10/2003 | Wojnarowski | ...... | H01L 25/0753 257/E25.02 |
| 6,686,654 B2 * | 2/2004 | Farrar | ................ | H01L 25/0652 257/685 |
| 7,420,268 B2 * | 9/2008 | Chen | ........................ | F21K 9/00 257/686 |
| 8,562,161 B2 | 10/2013 | Tong et al. | | |
| 8,926,130 B2 | 1/2015 | Li et al. | | |
| 9,557,041 B2 | 1/2017 | Chien et al. | | |
| 9,599,289 B2 | 3/2017 | Imai | | |
| 9,618,190 B2 | 4/2017 | Motoki et al. | | |
| 9,857,042 B2 | 1/2018 | Song | | |
| 2005/0276063 A1 | 12/2005 | Coushaine et al. | | |
| 2007/0001282 A1 * | 1/2007 | Kang | .................. | H01L 23/5385 257/692 |
| 2008/0291688 A1 | 11/2008 | Higashi | | |
| 2017/0146211 A1 | 5/2017 | Wu | | |

FOREIGN PATENT DOCUMENTS

| | | |
|---|---|---|
| CN | 207602619 U | 7/2018 |
| EP | 2760058 B1 | 1/2018 |
| JP | 2011-181418 A | 9/2011 |
| JP | 2013-069837 A | 4/2013 |
| JP | 2013-093130 A | 5/2013 |
| JP | 2014-120388 A | 6/2014 |
| KR | 101682131 B1 | 12/2016 |
| WO | 20091037645 | 3/2009 |
| WO | 2016/156463 A1 | 10/2016 |

OTHER PUBLICATIONS

Written Opinion of the International Search Authority dated Mar. 12, 2020 for PCT International Application No. PCT/EP2019/072250.
European Search Report dated Apr. 20, 2020 for European Patent Application No. EP 18193218.

* cited by examiner

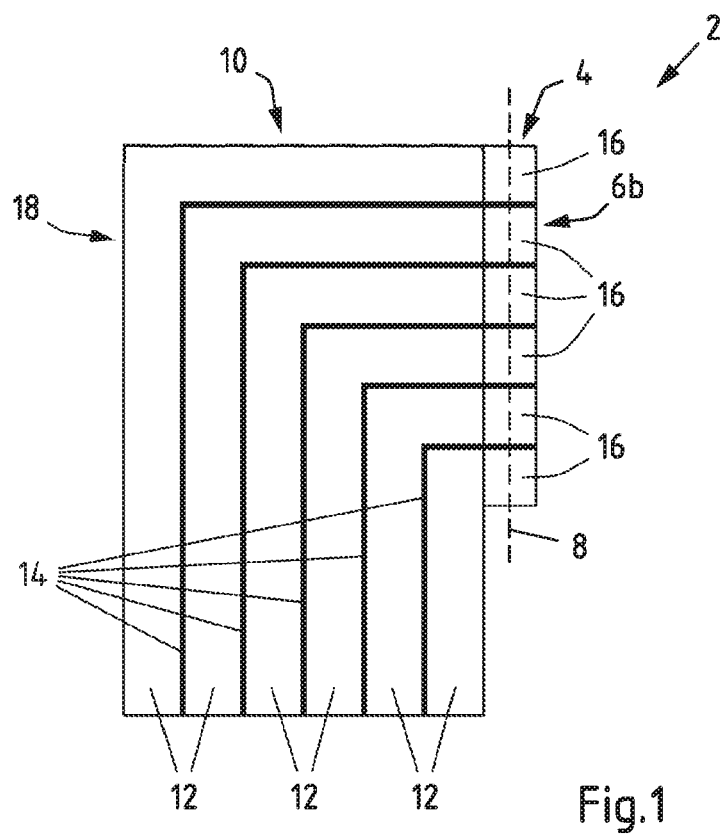
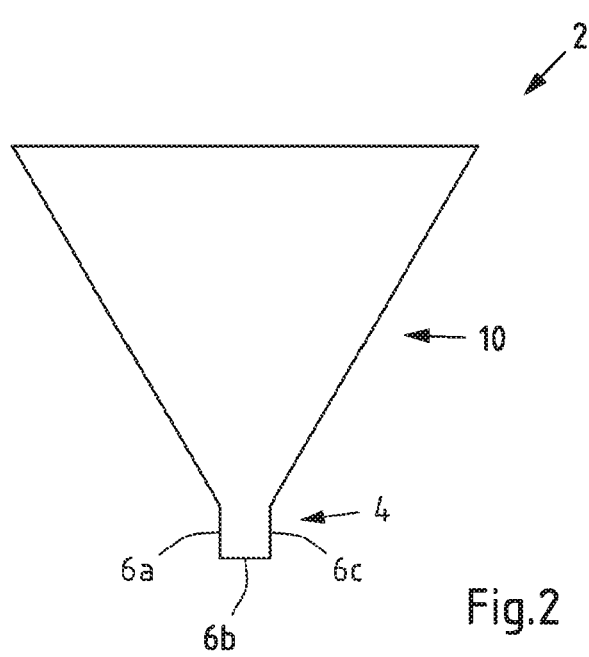
Fig.1
Fig.2

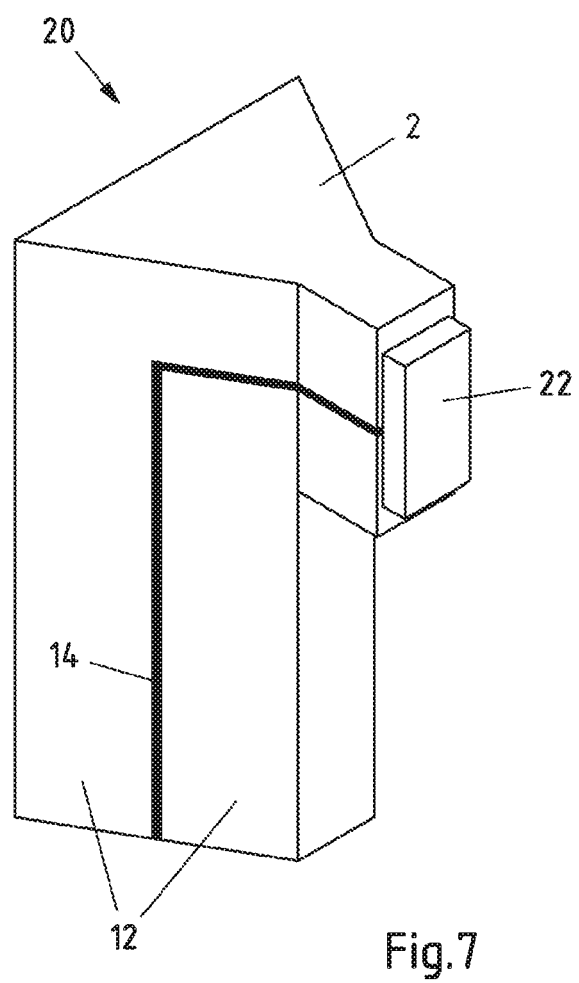

SUPPORT FOR LIGHT-EMITTING ELEMENTS AND LIGHTING DEVICE

FIELD OF INVENTION

The present disclosure relates to a support for light-emitting elements in a lighting device, in particular comprising a layered structure, for improved heat transport and optical characteristics in applications such as automotive lighting.

BACKGROUND

Recently, efforts have been made to replace traditional light sources such as incandescent light sources comprising a wire filament by lighting devices comprising light-emitting elements such as LEDs. For some specific applications, for instance in automobile lighting, it is desirable to perform a "retrofitting" of such lighting devices. For example, it is advantageous if only the traditional light source such as an incandescent light bulb is replaced by a LED lighting device, while the remaining elements of the lamps, e.g. optical elements such as reflector cups and lenses, do not require replacement. Hence, there are efforts to offer such retrofitting lighting devices that represent a 1:1 replacement for traditional standard light sources, for example H7 halogen bulbs.

Configuring lighting devices for retrofitting traditional light sources is however challenging. Firstly, as the lighting device is intended to make use of the same optical elements as a traditional light source, the illumination pattern of the traditional light source has to be mimicked closely by the arrangement and specification of the light-emitting elements. For example, it may be required that LEDs are arranged in a manner representing the shape of a filament of an incandescent light source, with LEDs being arranged along an arrangement direction. Secondly, the heat transport from the LEDs has to be effective to ensure a long lifetime of the LEDs, which is particularly challenging as reproducing the illumination pattern of the traditional light source may require arranging multiple LEDs very close to each other, which may lead to concentration of heat within a small volume. For retrofitting applications such as in automotive lighting, a high light output is required, which also leads to a high heat output of the light-emitting elements. Thirdly, the light-emitting elements have to be provided with electrical energy in an efficient manner, wherein additional heat generation in the electrical connections should be reduced.

There have been attempts to provide supports for LEDs for retrofit applications based on printed circuit boards (PCBs), which may provide electrical connection of the LEDs with an effective heat transport. However, PCBs restrict the arrangement of LEDs to a substantially flat or two-dimensional shape, so that a mimicking the shape of a filament with PCBs as a support is unsatisfactory.

Other supports from the prior art still require to arrange a significant number of LEDs connected in parallel on conductors with a small cross-sections, such that the heat transport may still be optimized further.

EP 2 760 058 B1 relates to an LED module comprising a column-shaped substrate comprising a first metal plate, a second metal plate, and an insulation layer between the first and second metal layers.

U.S. Pat. No. 7,420,268 B2 discloses a semiconductor chip package, comprising a pillar body including at least three conductors insulated from each other by an insulating layer, the pillar body having a periphery that includes a plurality of mounting faces.

SUMMARY

It is an object of the present invention to provide a support for light-emitting elements that provides effective heat transport and electrical conduction when at least one light-emitting element is arranged on the support. The support also may provide for various shapes and in particular three-dimensional arrangements of light-emitting elements, allowing for optical properties desirable in retrofitting applications. The invention further relates to a lighting device that improves heat transport and the illumination pattern in particular for retrofitting applications. The invention further relates to a method for producing such a lighting device.

According to a first aspect of the present invention, a support for light-emitting elements is proposed, the support comprising: a mounting section with at least one mounting face, wherein the at least one mounting face has an arrangement direction and is configured for accommodating at least one light-emitting element arranged along the arrangement direction; a body section arranged adjacent to the mounting section; and conductors for providing electric connection from the body section to the at least one mounting face; wherein the at least one mounting face comprises at least two contact sections along the arrangement direction, each contact section corresponding to a conductor and being separated by an insulating section, and wherein the body section protrudes sidewards from the at least one mounting face relative to the arrangement direction.

According to a second aspect of the present invention, a lighting device is proposed comprising: a support according to the first aspect of the invention; and at least one light-emitting element mounted along the arrangement direction of the at least one mounting faces, wherein the at least one light-emitting element is in electrical contact to the at the least two contact sections.

According to a third aspect of the present invention, a method for producing a lighting device is proposed, in particular a lighting device according to the second aspect of the invention, the method comprising: providing a support according to the first aspect of the invention; mounting at least one light-emitting element along the arrangement direction of the at least one mounting face, wherein the at least one light-emitting elements is brought into electrical contact to the contact sections.

Exemplary embodiments of the first, second, and third aspect of the invention may have one or more of the properties described below.

The support comprises a mounting section with at least one mounting face. The mounting face(s) may provide a suitable mounting surface for one or more light-emitting elements. For instance, the mounting face(s) may be at least partially flat or planar to provide an area suitable to accommodate a light-emitting element such as an LED die. The at least one mounting face has an arrangement direction and is configured for accommodating at least one light-emitting elements arranged along the arrangement direction. The arrangement direction may correspond to an extension direction of the at least one mounting face and/or the at least one light emitting element. For instance, the arrangement direction may correspond to a longest dimension of the at least one mounting face and/or the at least one light emitting element. The at least one mounting face may in particular be configured such that multiple light-emitting elements may be arranged along a line, e.g. a straight line, wherein the arrangement direction corresponds to the orientation of the line of light-emitting elements. In some embodiments, the at least one mounting face may be configured to accommodate only a single light-emitting element, wherein the light-emitting element has for instance an elongated (rectangular) shape with the arrangement direction corresponding to the direction of elongation.

In embodiments of the support for use in lighting devices that are intended to replace incandescent light sources with a filament, the arrangement direction may correspond to the extension direction of the filament, i.e. the direction of the longest dimension of the filament. The at least one mounting face may then accommodate at least one light-emitting element to effectively mimic the illumination of an incandescent light source.

A body section is arranged adjacent to the mounting section, wherein in particular the body section is in thermal contact to the mounting section, such that heat generated by one or more light-emitting elements mounted on the at least one mounting face may be transferred from the mounting section to the body section. The body section may in particular comprise a volume and/or surface configured to provide heat dissipation suitable for the heat generated by light-emitting element(s) and to provide cooling for the light-emitting element(s).

The conductors may provide an electric connection from the body section to the at least one mounting face. The body section may for instance be connected to a power source, e.g. by means of a socket. The conductors may provide a transfer of electrical power from the body section to the mounting section and therefore to one or more light-emitting elements mounted on the at least one mounting face. Further, the body section may act both as a heat sink as well as a heat conductor to the environment of the support.

The at least one mounting face comprises at least two contact sections along the arrangement direction. Contact sections may for example be configured as contact patches or contact areas on the surface of the mounting face(s) that allow for an electrical contact with a light-emitting device, for instance by soldering or by means of a conductive adhesive. Each contact section corresponds to a conductor and is therefore electrically connected to the body section, such that a for instance a voltage may be applied between neighboring contact sections when the body section is connected to a power source. Each neighboring contact section may be separated by an insulating section.

As already mentioned above, the body section may provide an electrical connection to the at least one mounting face and may act simultaneously as a heat sink as well as a heat conductor, which is particularly advantageous when light-emitting elements with a high heat output are used, e.g. LED light sources for high current applications such as automotive head lighting. As the body section protrudes sidewards from the at least one mounting face, in particular the volume of the body section is enlarged, and the body section provides significantly improved heat transfer from the mounting section. The electrical conductivity may also be improved due to an enlarged cross section of the conductors, allowing to supply the light-emitting elements accommodated on the at least one mounting face with high currents. Further, it has been found that the support according to the invention may allow for a close mimicking of the illumination of traditional light sources such as incandescent light sources based on a filament. In particular, the illumination pattern of light sources such as halogen bulbs may be reproduced very closely with light-emitting elements (e.g. at least one LED) based on the support. Hence, the support according to invention may provide an optimization of optical, thermal, and electrical aspects of retrofitting light sources.

Under "protruding sidewards", it may in particular be understood that when a viewer faces the at least one mounting face (for instance in a direction perpendicular to the surface of the mounting face), the body section extends at least beyond one edge of the at least one mounting face. E.g. the body section may protrude sidewards relative to the arrangement direction in that the body section extends beyond at least one edge of the at least one mounting face, wherein the at least one edge extends substantially parallel to the arrangement direction.

According to an exemplary embodiment of the invention, the body section has at least in sections an increasing cross-sectional area with increasing distance from the mounting section. With this, the optical properties of a lighting device based on the support may be further improved in that a smaller amount of light emitted by light-emitting elements accommodated in the mounting section is blocked by the body section, while the body section may be provided with a high volume and surface area to optimize the thermal properties. In particular, when a triangular cross section is provided at least in sections with the mounting section being arranged on an edge of the triangular cross section, the volume and surface area of the body section is optimized while the amount of light blocked or reflected by the body section can be controlled by choosing an appropriate opening angle of the triangular cross section. The opening angle of the triangular cross section may for instance be chosen for a large volume of the body section (larger opening angles) or larger angles of illumination (smaller opening angles).

In some embodiments, the triangular cross section may have an opening angle of 0° to 90°, i.e. >0° to 90°. In this range, the thermal properties of the body are sufficient for many applications while providing an angle of illumination that is suitable in particular for retrofitting applications. When an opening angle in the range of 30° to 45° is chosen, the angle of illumination may be improved. For applications with higher heat generation requiring a higher heat transfer by the body section, opening angles in the range of 50° to 70°, in particular about 60° have been found to be advantageous.

According to another embodiment of the invention, the mounting section and/or the body section comprise a layered structure of conductors and insulating layers. A layered structure represents a particularly simple configuration to provide the mounting section and/or body section with conductors, wherein in particular the mounting section and/or body section may integrally be formed by the layered structure. The conductors may also form at least part of the contact sections, such that the mounting face(s) may also comprise a layered structure of contact sections.

According to another exemplary embodiment of the invention, the conductors comprise metallic sheet material. By using sheet material, a layered structure of the body section and/or mounting section may be provided in a particularly simple manner, wherein the support may be produced cost-effectively. For instance, the size and thickness of sheet material may be chosen according to the requirements in electrical and thermal conductivity of the support. Different metallic materials are possible as a basis for the sheet material. In an embodiment, the metallic sheet material is based or consists of copper. Copper may provide very high electrical and thermal conductivity in view of acceptable material costs.

According to another exemplary embodiment of the invention, the metallic sheet material comprises a main face and side faces, wherein each of the contact sections is respectively at least partially formed by a side face of metallic sheet material. The main face of the sheet material may be the surface of the sheet material with the largest dimensions. When the contact sections are formed by a side face of the metallic sheet material, for instance, the contact sections may have appropriate (small) dimensions for an electrical and thermal contact to at least one light emitting element, while the metallic sheet material may provide a large volume and cross section for electrical and thermal transport.

According to another exemplary embodiment of the invention, an extension direction of the layered structure of conductors and insulating layers extends substantially perpendicular to the arrangement direction of the at least one mounting face in the mounting section. In particular, the layered structure is based on metallic sheet material extending substantially perpendicular to the arrangement direction of the at least one mounting face. The extension direction in this sense may represent a direction that is parallel to the layers of the layered structure. As the electrical and thermal transport may predominantly be provided by the conductors (e.g. the metallic sheet material), with an extension direction being substantially perpendicular to the arrangement direction, a very direct and effective electrical and thermal transfer from the mounting section to the body section can be obtained.

In other embodiments, the extension direction of the layered structure of conductors, in particular of the metallic sheet material, and insulating layers extends substantially parallel to the arrangement direction of the at least one mounting face. Under "substantially perpendicular", angles of 90°+/−10° and in particular of 90°+/−5° may be understood. Under "substantially parallel", angles of 0°+/−10° and in particular of 0°+/−5° may be understood.

According to another exemplary embodiment of the invention, the layered structure of conductors (e.g. the metallic sheet material) and insulating layers comprises an angled section. With an angled section, the mounting section may be arranged in a specific orientation in respect to a length of the body section, i.e. in respect to a longest dimension of the body section. For example, the body section may have a first end configured for an electrical connection to a power source, e.g. via a socket, a second end opposite the first end and side faces connecting the first end to the second end. The mounting section may be provided at a side face of the body, wherein the heat transfer is improved further. In particular, the angled section may be configured such that the length of the body section extends substantially parallel to the arrangement direction. Besides optimizing heat transfer, such an arrangement resembles the arrangement in a variety of traditional light sources.

According to another exemplary embodiment of the invention, the mounting section comprises at least two mounting faces. By using multiple mounting faces, the illumination provided by a filament can be mimicked with higher precision. For instance, the arrangement direction of each mounting face may be substantially parallel to each other, wherein the mounting faces represent different sides of the filament. In particular, at least two mounting faces are arranged adjacent to each other, such that a continuous area for mounting light-emitting elements is obtained. At least two mounting faces may be arranged substantially parallel to each other, for example, to obtain several areas of illumination towards the same direction and in particular for mimicking light sources with multiple filaments. At least two mounting faces and in particular adjacent mounting faces may be arranged at an angle to each other, for instance with an enclosing angle in the range of 45° to 135°, in particular 45° to 75° or substantially perpendicular to each other. For instance, the mounting faces arranged at an angle to each other may represent different sides of a filament and/or provide an increased angle of illumination.

According to another exemplary embodiment of the invention, the mounting section comprises three mounting faces. Further, one of the three mounting faces may be arranged between the other two mounting surfaces and may optionally be arranged directly adjacent to the other two mounting faces. The mounting section may for example comprise four sides, with three sides providing the mounting faces and the fourth side providing contact to the body section. In particular, one of the three mounting faces may be arranged with an enclosing angle of 45° to 135°, in particular 45° to 75° or substantially perpendicular to the other two mounting faces.

According to a next exemplary embodiment of the invention, the at least one mounting face is configured for accommodating multiple light-emitting elements arranged along the arrangement direction. The light-emitting elements may for example be arranged along the arrangement direction in a line, in particular in a straight line to represent the extension direction of a filament. The at least one mounting face may comprise at least three alternating contact sections along the arrangement direction, each alternating contact section corresponding to a conductor and being separated by an insulating section. In an embodiment, the alternating contact sections are configured to provide alternating polarities. For instance, the polarities between neighboring contact sections are reversed in respect to each other (such as sequences like +/−/+ or −/+/−). The light-emitting elements may be brought into contact to two contacting sections with different polarities, e.g. light-emitting elements may be brought into contact to two neighboring alternating contacting sections.

For example, multiple light-emitting elements may be arranged along the arrangement direction in a line, e.g. in a "1×N"-configuration. Each light-emitting element of the "1×N"-configuration arranged along the arrangement direction may be in contact to a different pair of alternating contact sections. Configurations with multiple light-emitting elements being in contact to the same pair of alternating contact sections are also possible, e.g. for arrays of light-emitting elements such as "2×N"-configurations, "3×N"-configurations or even larger arrays.

By providing at least three alternating contact sections along the arrangement direction, heat transfer and electrical conduction to light-emitting elements mounted on the mounting faces may be improved in that the number of conductors providing heat transfer and electrical conduction is increased, and heat may in particular be transferred effectively to the body section. For example, in a "1×N"-configuration with N light-emitting elements arranged along the arrangement direction, N+1 contact sections and N+1 conductors may be provided to optimize heat transfer. The support according for the invention therefore may offer improved efficiency and lifetime of light-emitting elements compared to simple columnar shapes of the prior art, in which multiple light-emitting elements are connected in parallel and heat transfer is effected via the same conductors.

Providing at least three alternating contact sections also opens the possibility to operate single or multiple light-emitting elements independently of each other.

The lighting device according to the second aspect comprises a support according to the first aspect and at least one light-emitting element mounted along the arrangement direction of the at least one mounting faces. The at least one light-emitting element is in electrical contact to at least two contact sections, for example in that contact patches of the at least one lighting element are in respective electrical contact to the contact sections. An electrical contact and/or mechanical connection may for instance be based on a soldered contact (e.g. by means of solder paste) and/or a contact with a conductive adhesive. The at least one light-emitting element may be operated by applying a voltage to the conductors that are associated with the corresponding contact sections. For instance, the body section may be configured to provide electrical contact to a power source.

Accordingly, in a next embodiment of the invention, the lighting device may further comprise a socket for connection to a power source, wherein the socket is connected to the body section. The socket is in particular a standard socket suitable for the intended application and in particular for the required type of retrofitting. In some embodiments, the socket may be a standard socket of a halogen light bulb and/or a light bulb for automotive applications. One example of such a socket is a H7 socket.

The body section and the mounting section with the at least one mounting face may be arranged to mimic the arrangement of a filament and the mounting in a traditional light source. For instance, the arrangement direction and the arrangement of the light-emitting element(s) in particular correspond to the arrangement of a standard filament such as a halogen filament. When a socket is used, in particular the distance and orientation of the mounting face(s) to the socket may correspond to the distance and orientation of a filament to a socket in a traditional light source.

With the method according to the third aspect, the at least one light-emitting elements is brought into electrical contact to the contact sections, for example in that contact patches of the at least one lighting element are electrically connected to the contact sections. The electrical contact may for example be established by means of soldering, in particular by using solder paste, and/or by using conductive adhesive.

According to an exemplary embodiment of the invention, providing the support may comprise a stacking of metallic sheets. As mentioned above, a layered structure of conductors may be provided by using metallic sheet material such as copper sheets. The stacked metallic sheet material may provide the shape of the body section and/or the mounting section, as well as the conductors for providing electric connection from the body section to the at least one mounting face. In particular, metallic sheet may be stacked on the main faces of the metallic sheets. Insulating layers between the metallic sheets may be disposed to prevent electrical contact between the metallic sheets. In some embodiments, metallic sheet material may be provided as composite material with one or more insulating layers on the main face(s). In another exemplary embodiment, an adhesive is disposed on the metallic sheet material before and/or during stacking to form at least part of the insulating layers between the metallic sheets. By using an adhesive, the metallic sheets may be mechanically connected and insulated from each other simultaneously.

According to another exemplary embodiment of the invention, the metallic sheets are bent to form an angled section. A bending may be performed before the stacking of the sheets such that the sheets are at least partially brought into the shape required for the support. It is also possible that a bending is performed during or after stacking of the metallic sheets. For instance, a stack of metallic sheets with insulated layers disposed in between the metallic sheets may be provided as a composite material or semi-finished product and bent into the shape of the support.

According to another exemplary embodiment of the invention, providing the support comprises a material removal, in particular after a stacking of metallic sheets. For example, metallic sheets in a regular shape such as a rectangular shape may be used for stacking and providing at least part of the body section and/or mounting section. To obtain more complex shapes of the support, for instance the aforementioned triangular cross section of at least sections of the body section, specific shapes of one or more mounting faces such as mounting faces arranged at an angle to each other, etc., material of the metallic sheet material and/or the insulating layers may be removed. For example, the shape of the support may be at least partially obtained by milling, grinding, cutting, and/or etching.

According to another exemplary embodiment of the invention, the mounting of the at least one light-emitting element comprises: removably fixing the at least one light-emitting element on a supporting layer; applying a contact material on the at least one light-emitting element; and applying the at least one light-emitting element fixed on the supporting layer to the at least one mounting face, wherein the contact material connects the at least one light-emitting element to the contact sections. As the mounting face(s) may have a complex shape and may in particular be arranged in a three-dimensional (non-flat) manner, a reliable positioning of solder may not be possible by means of standard techniques such as solder masks, for instance. Solder masks may be difficult to apply to complex shaped and comparably small mounting faces. Further, when solder is disposed near the edge of a mounting face, the positioning and the amount of solder is hard to control. Especially during reflow of the solder, an undesired repositioning of light-emitting elements may therefore occur.

It has been found that it is advantageous to apply contact material such as solder paste on the at least one light emitting element, in particular on contact patches of the at least one light emitting element, for instance when the at least one light emitting element is already fixed on the supporting layer. The supporting layer may be used for a precise positioning of the at least one light-emitting element, wherein the at least one light-emitting element may be connected to the contact sections. For instance, the at least one light-emitting element is applied to the mounting face(s) such that the contact material touches the contact sections. The contact material may be subjected to reflow and/or curing. The supporting layer may be removed before, after or during the reflow and/or curing of the contact material.

According to another exemplary embodiment of the invention, applying the at least one light-emitting element fixed on the supporting layer to the at least one mounting face comprises bending the supporting layer to conform the shape of the at least one mounting face. Bending the supporting layer may in particular be useful to conform the shape of multiple mounting faces, such that light-emitting elements may be mounted on multiple mounting faces simultaneously.

In an embodiment, the light-emitting elements fixed on the supporting layer may be applied by means of SMT techniques. The supporting layer may be picked up by one or more holding devices such as suction nozzles. For instance, for each light-emitting element or groups of light-emitting elements (e.g. with each group corresponding to a mounting face), a holding device may be used. The holding devices may be positioned and rotated in respect to each other to obtain a shape of the supporting layer that corresponds to the shape of the mounting face(s) and to apply the light-emitting elements on the mounting face(s).

According to another exemplary embodiment of the invention, the supporting layer has at least one predetermined bend line. The bend line may for instance correspond to lines separating sections of the supporting layer, wherein each section corresponds to a light-emitting element or a group of light-emitting elements corresponding to a mounting face. By means of bend lines, the precision of the bending of the supporting layer and therefore the precision of the positioning of the light-emitting elements can be significantly improved. Bend lines may for instance be formed by perforations in the supporting layer. Other configurations may also be possible in addition or as alternative, such as a thickness reduction and/or a different material with higher flexibility compared to the remainder of the supporting layer.

According to another exemplary embodiment of the invention, applying the at least one light-emitting element fixed on the supporting layer to the at least one mounting face comprises a cutting of the supporting layer. In an embodiment, the supporting layer may be cut before the light-emitting element(s) are fixed on the supporting layer. For instance, the supporting layer may be cut into segments, wherein each segment supports a group of light-emitting elements. Each group of light-emitting elements may for example correspond to a mounting face, such that strips of supporting layers are obtained that can be applied independently to each mounting face. In another embodiment, the supporting layer may be cut after fixing the light-emitting element(s), but before contact material is applied. In another embodiment, the supporting layer may be cut after the at least one light-emitting element has been fixed and the contact material has been applied.

As a supporting layer, for instance polyimide adhesive tape may be used. The polyimide adhesive tape may be removed after the contact material has been cured, e.g. after a reflow of solder paste used as contact material. In another embodiment, a supporting layer with a curable adhesive layer on the surface may be used, e.g. an UV curable adhesive tape. In this case, the supporting layer can be removed more easily before curing the contact material by exposing the UV curable adhesive to UV light, wherein the light-emitting element(s) may be released from the supporting layer. A curing of the contact material may then be performed without the supporting layer.

The at least one light-emitting element may in particular comprise at least one semiconductor element capable of light emission. In particular, at least one light-emitting element may comprise at least one LED. LEDs may comprise at least one semiconductor element such as a p-n-junction, a diode, and/or a transistor. For instance, the LEDs may be provided in form of separate or combined LED dies and/or LED packages, wherein particular at least one LED may be arranged on a substrate, e.g. a sapphire substrate. An LED package may comprise a wavelength conversion element (e.g. based on phosphor) and/or may comprise at least one optical element such as a diffusing layer, a diffractive element (e.g. a lens) and/or a reflective element (e.g. a reflector cup). The LED or LEDs may for instance be integrated into an LED lead frame.

The support and/or the lighting device according to the invention may in particular be configured for a use in automotive lighting, e.g. as automotive head light.

The features and example embodiments of the invention described above may equally pertain to the different aspects according to the present invention. In particular, with the disclosure of features relating to the support and the lighting device according to the first and second aspect, also corresponding features relating to the method according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which:

FIG. 1 shows a schematic representation of a first embodiment of a support in a side view;

FIG. 2 shows a schematic representation of the first embodiment of a support in a top view;

FIG. 7 shows a schematic representation of a second embodiment of a support and a third embodiment of a lighting device in a perspective view.

DETAILED DESCRIPTION OF THE PREFERRED EMBODIMENT(S)

Figure 3:
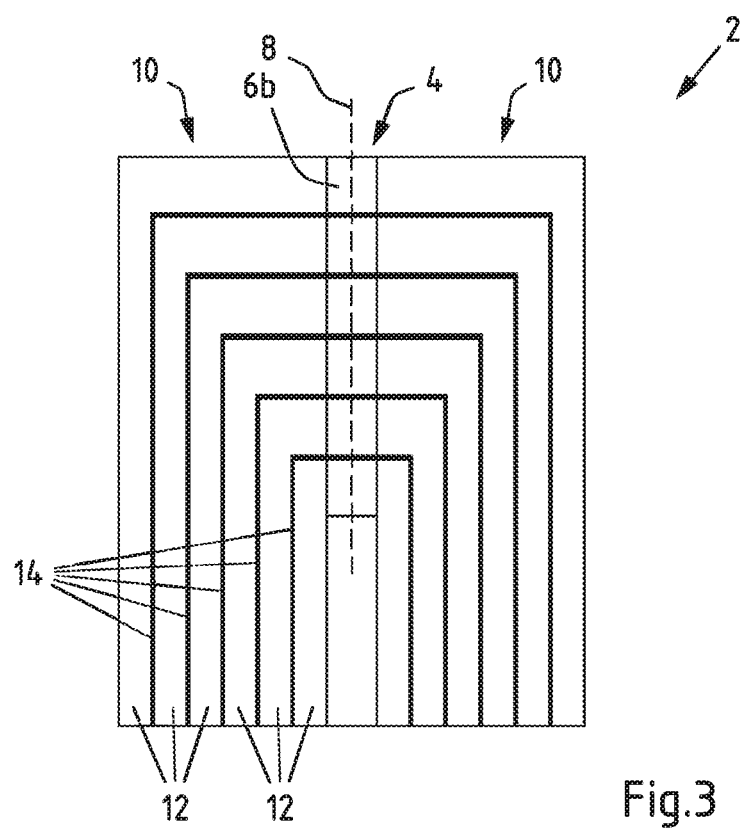
FIG. 3 shows a schematic representation of the first embodiment of a support in a front view.
Figure 4:
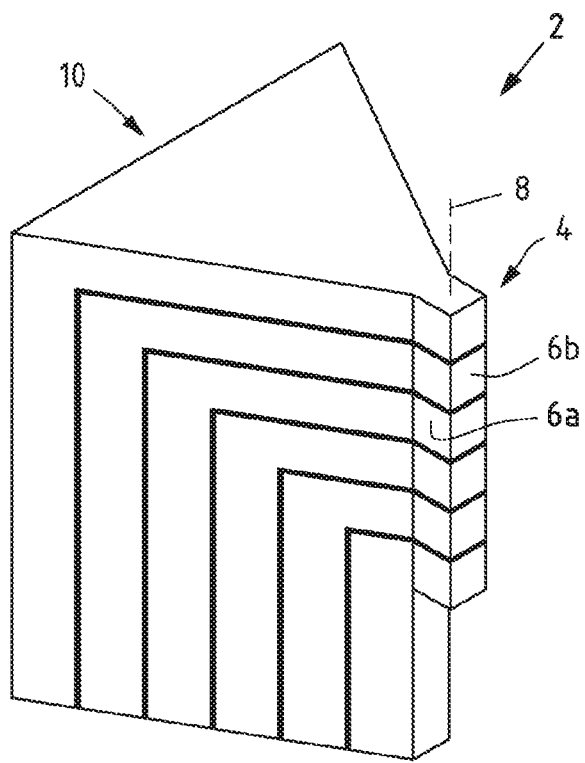
FIG. 4 shows a schematic representation of the first embodiment of a support in a perspective view.

FIGS. 1, 2, and 3 show schematic representations of a first embodiment of a support 2 for at least one light-emitting element in a side view, top view, and front view, respectively. In FIG. 4, the first embodiment of a support 2 is shown in a perspective view.

As can be seen in particular in FIGS. 1 and 2, the support 2 comprises a mounting section 4 with three mounting faces 6a, 6b, 6c, wherein the mounting faces 6a, 6b, 6c have an arrangement direction 8. The mounting faces 6a, 6b, 6c are configured for accommodating light-emitting elements arranged along the arrangement direction 8. The mounting face 6b is arranged between the other two mounting surfaces 6a, 6c and is arranged substantially perpendicular to the other two mounting surfaces 6a, 6c.

A body section 10 is arranged adjacent to the mounting section 4 and is in thermal contact to the mounting section 4. The support 2 comprises conductors 12 for providing electric connection from the body section 10 to the mounting faces 6a, 6b, 6c, such that light-emitting elements may be provided with electrical power by connecting the body section 10 to a power source. The mounting section 4 and body section 10 comprise a layered structure of conductors 12 formed from metallic sheet material, in particular sheet material based on copper, and insulating layers 14 disposed in between the conductors 12.

An extension direction of the metallic sheet material forming the conductors 12 and the insulating layers 14 extends substantially perpendicular to the arrangement direction 8 of the mounting faces 6a, 6b, 6c in the mounting section. In part of the body section 10, the extension direction extends substantially parallel to the arrangement direction 8. The layered structure of conductors 12 and insulating layers 14 comprises an angled section 18, wherein a length of the body section 10 extends substantially parallel to the arrangement direction 8.

As can be seen in FIG. 1, the mounting faces 6a, 6b, 6c comprise contact sections 16 along the arrangement direction 8, each contact section 16 corresponding to a conductor 12 and being separated by an insulating section formed by the insulation layers 14. The metallic sheet material forming the conductors 12 comprises a main face and side faces, wherein each of the contact sections 16 is respectively formed by a side face of metallic sheet material.

As can be seen in particular from the front view in FIG. 3, the body section 10 protrudes sidewards from the mounting faces 6a, 6b, 6c relative to the arrangement direction 8. For instance, when a viewer faces the mounting face 6b, the body section extends beyond the edges of the mounting faces 6a, 6b, 6c. That is, the body section 10 has an increased width in comparison to the mounting section 4.

The body section 10 has an increasing cross-sectional area with increasing distance from the mounting section 4, which is in particular apparent from the top view in FIG. 2. The body section 10 has a triangular cross section with the mounting section 4 being arranged on an edge of the triangular cross section. The triangular cross section has an opening angle of 45°. As already mentioned above, the body section may provide an electrical connection to the at least one mounting face and may act simultaneously as a heat sink as well as a heat conductor, which is particularly advantageous when light-emitting elements with a high heat output are used, e.g. LED light sources for applications such as automotive head lighting. As the body section 10 protrudes sidewards from the mounting faces 6a, 6b, 6c, the volume of the body section 10 is enlarged, and the body section 10 provides significantly improved heat transfer from the mounting section 4 while at the same time providing effective electrical conductivity and optical properties suitable for retrofitting applications.

In particular, the illumination pattern of light sources such as halogen bulbs may be reproduced very closely with light-emitting elements mounted in the mounting faces 6a, 6b, 6c of the support 2. Each of the mounting faces 6a, 6b, 6c is configured for accommodating multiple light-emitting elements arranged along the arrangement direction 8. In this first embodiment, the mounting faces 6a, 6b, 6c each comprise six alternating contact sections 16 along the arrangement direction 8, each alternating contact section 16 corresponding to a conductor 12 and being separated by an insulating section 14. The arrangement direction may correspond to the extension direction of a filament in an incandescent light source.

Figure 5:
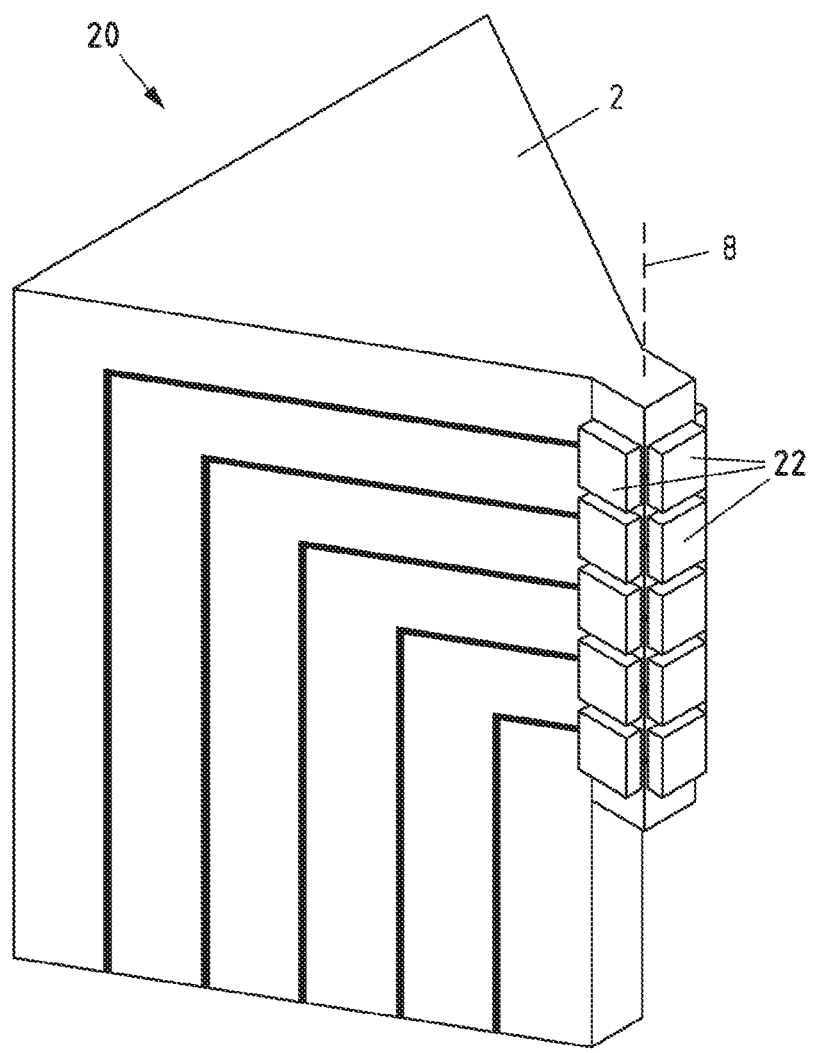
FIG. 5 shows a schematic representation of a first embodiment of a lighting device in a perspective view.

A first embodiment of a lighting device 20 according to the invention is shown in FIG. 5, wherein the lighting device 20 comprises the first embodiment of a support 2 as depicted in FIGS. 1-4. Five light-emitting elements 22 are mounted along the arrangement direction 8 of each mounting face 6a, 6b, 6c. Each light-emitting element 22 is in electrical contact to two neighboring alternating contact sections 16.

Figure 6:
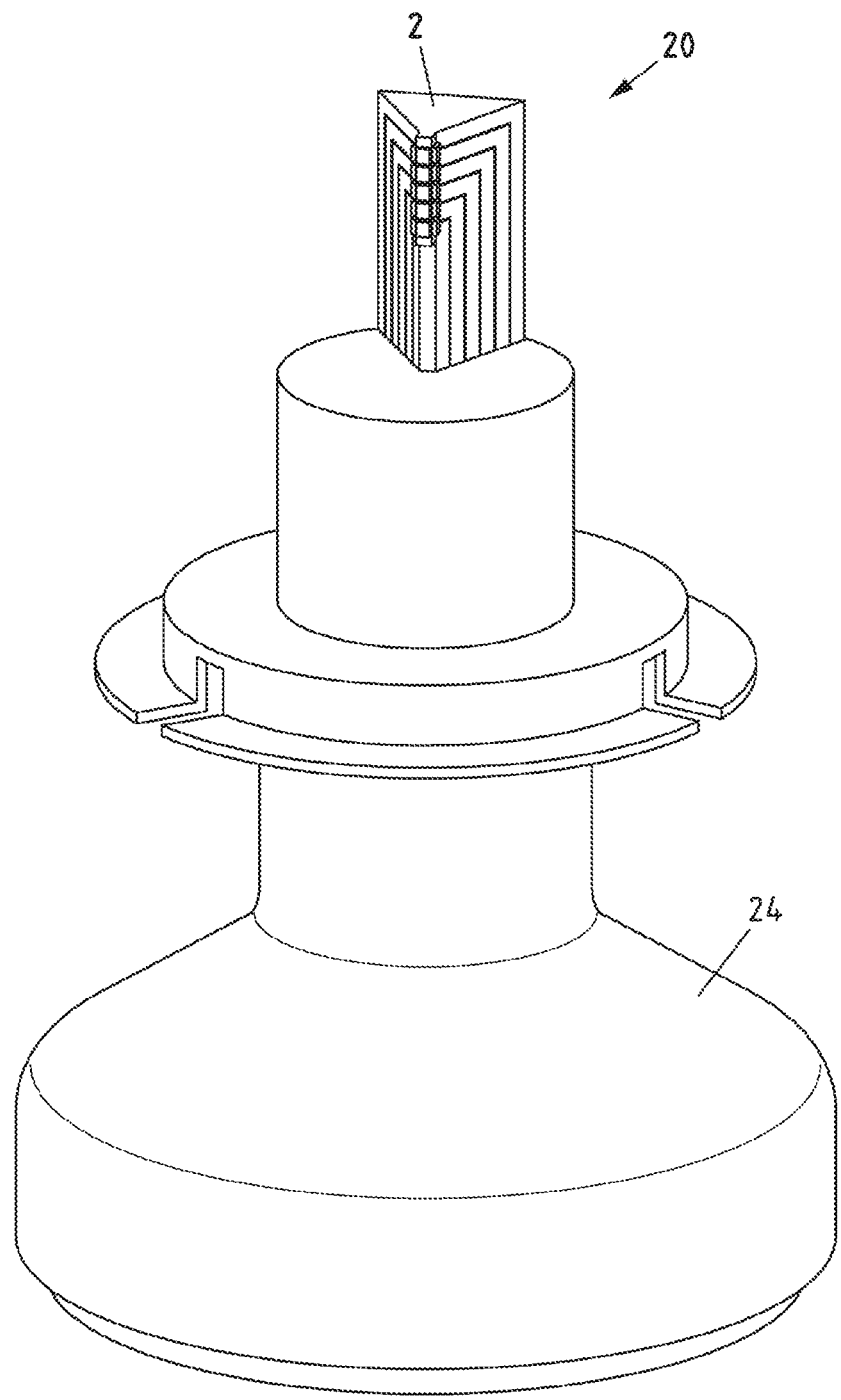
FIG. 6 shows a schematic representation of a second embodiment of a lighting device in a perspective view.

In FIG. 6, a second embodiment of a lighting device 20 according to the invention is shown, wherein a socket 24 for connection to a power source is provided, wherein the socket 24 is connected to the body section 10 of the support 2. The support 2 is configured according to the first embodiment shown in FIGS. 1-4. The socket 24 represents a standard socket corresponding to a H7 halogen lamp in automobile applications.

FIG. 7 shows a perspective view of a second embodiment of a support 2 and a third embodiment of a lighting device 20 according to the invention. In these embodiments, the mounting face 6 is configured for a single light-emitting element 22, which has an elongated shape along the arrangement direction 8. The body section 10 and the mounting section 4 comprise two conductors 12 separated by an insulating layer 14.

FIG. 8a-d show schematic illustrations of a method for producing a lighting device according to the invention and in particular for producing the lighting device according to the first embodiment.

A support 2 is provided, e.g. configured according to the first embodiment shown in FIGS. 1-4. The support 2 may be provided by stacking of metallic sheets and disposing insulating layers between the metallic sheets, wherein the insulating layers can be formed by adhesive applied to the metallic sheets. The metallic sheets may be bent to form an angled section with a substantially perpendicular angle and a material removal may be performed to obtain a shape of the support 2 as depicted in FIGS. 1-4.

Figure 8A:
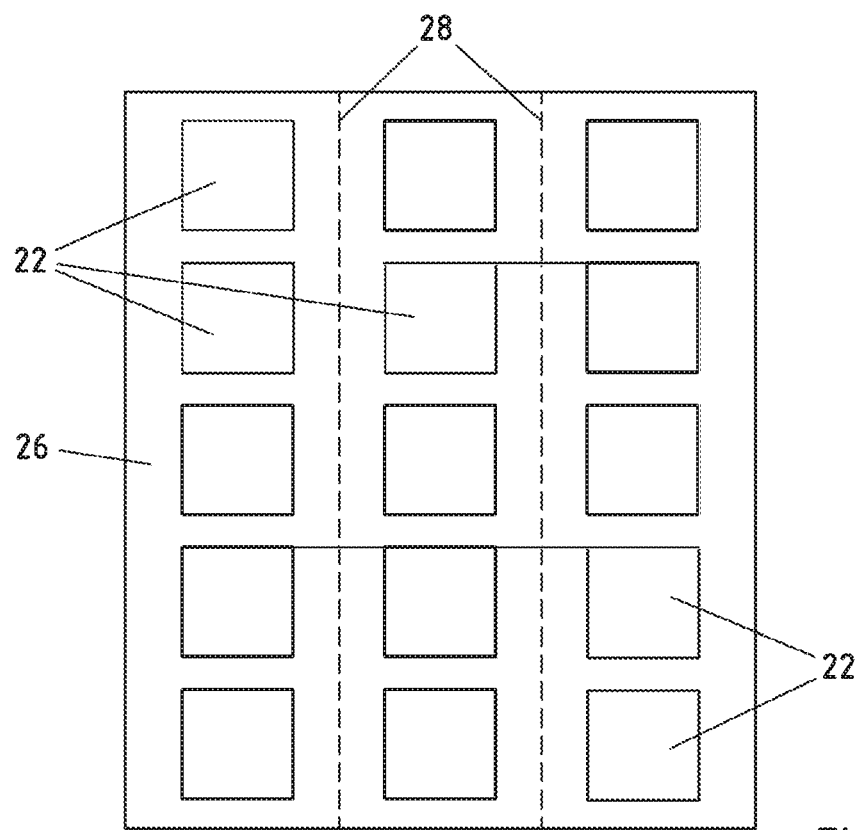
FIG. 8a-d show schematic representations of an embodiment of a method for producing a lighting device.
Figure 8B:
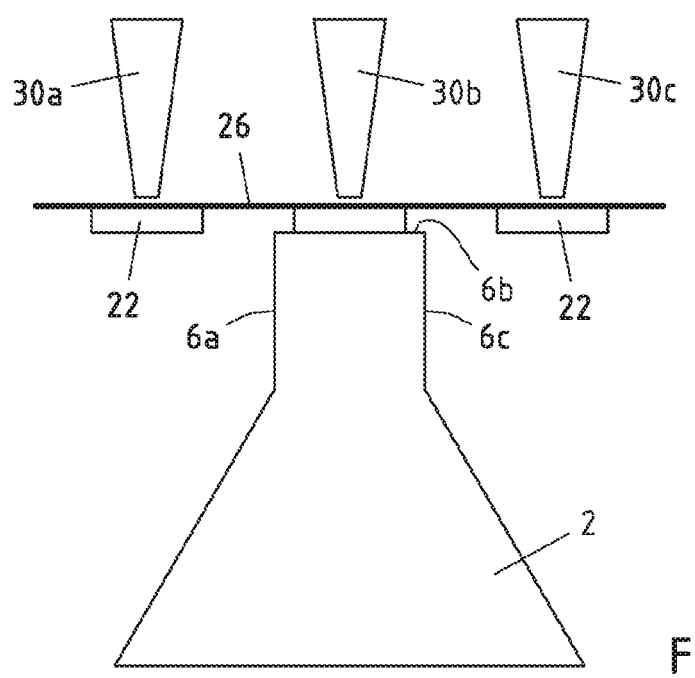

Light-emitting elements 22 are then mounted on the support 2 as shown in FIG. 8a-d. FIG. 8a represents a front view, wherein the light emitting elements 22 are removably fixed on a supporting layer 26, for instance an adhesive polyimide tape or an UV curable adhesive tape. The supporting layer 26 has predetermined bend lines in form of perforations 28 that divide the light-emitting elements 22 into groups, each group corresponding to a mounting face 6a, 6b, 6c. Solder paste as a contact material is applied on contact sections of the light-emitting elements 22 (not shown).

Figure 8C:
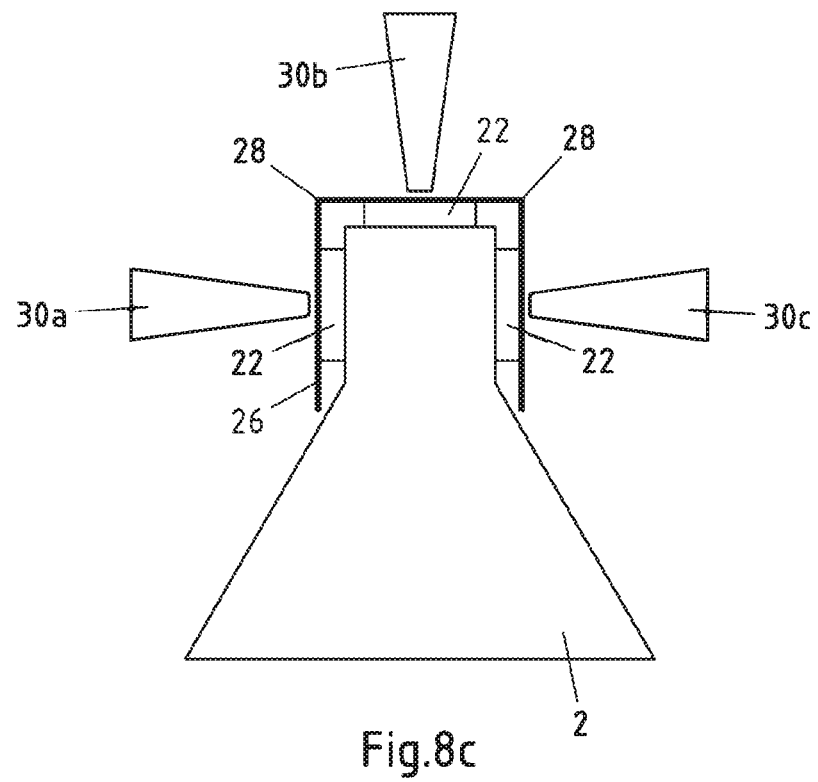

The supporting layer 26 is picked up by suction nozzles 30a, 30b, 30c of a holding device. Three suction nozzles 30a, 30b, 30c or three groups of suction nozzles 30a, 30b, 30c are used, each corresponding to a group of light-emitting elements 22 and a mounting face 6a, 6b, 6c. After the light-emitting elements 22 corresponding to mounting face 6b have been applied, as shown in a top view of the support 2 in FIG. 8b, the suction nozzles 30a, 30c are repositioned and rotated such that the supporting layer 26 is bent at the perforations 28 to conform the shape of the mounting faces 6a, 6b, 6c, as shown in FIG. 8c.

As an alternative, the supporting layer 26 may be cut into strips, each strip corresponding to a mounting face 6a, 6b, 6c (not shown) and the strips are applied in a similar manner.

Figure 8D:
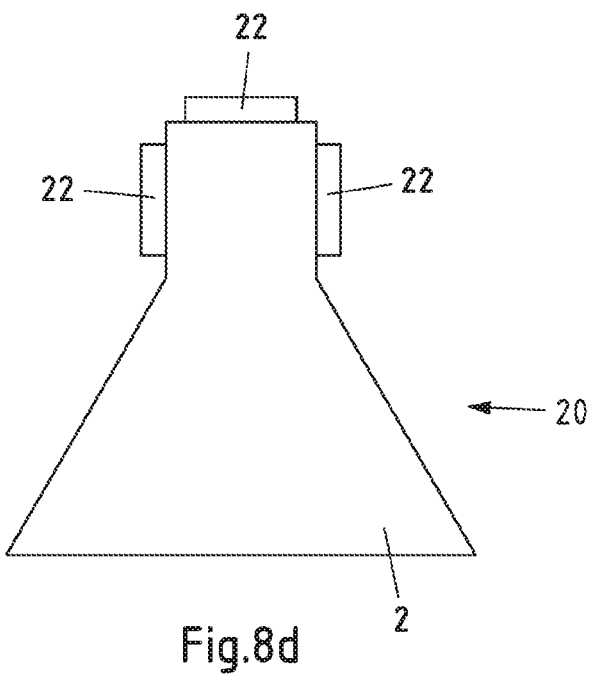

The solder paste is subjected to a reflow after positioning of the light-emitting elements 22 such that the solder paste permanently connects the light-emitting elements 22 to the contact sections 16 of the mounting faces 6a, 6b, 6c. The supporting layer 22 may be removed from the light-emitting elements after reflow (e.g. when adhesive polyimide tape is used) or before reflow (e.g. when using UV curable adhesive tape that can be exposed to UV light to reduce adhesion to the light-emitting elements 22). A light-emitting device 20 is obtained as shown in FIG. 8*d*.

What is claimed is:

1. A support for light-emitting elements, the support comprising:
   a layered structure of alternating conductors and insulating layers, the layered structure comprising a mounting section and a body section adjacent the mounting section,
   the mounting section comprising:
      at least one mounting face that has an arrangement direction, and
      at least three alternating contact sections along the arrangement direction, each contact section electrically coupled to one of the conductors and separated from a neighboring one of the contact sections by one of the insulating layers, and
   the body section having a width that protrudes sidewards from the at least one mounting face and a length that extends substantially parallel to the arrangement direction.

2. The support according to claim 1,
   wherein the width of the body section increases with increasing distance from the mounting section.

3. The support according to claim 2, wherein the body section has a triangular cross section with the mounting section disposed on an edge of the triangular cross section.

4. The support according to claim 3,
   wherein the triangular cross section has an opening angle of 0° to 90°.

5. The support according to claim 1,
   wherein the conductors comprise metallic sheet material.

6. The support according to claim 5,
   wherein the metallic sheet material comprises a main face and side faces, and each of the contact sections is respectively at least partially formed by one of the side faces of the metallic sheet material.

7. The support according to claim 1,
   wherein, within the mounting section, the layered structure of conductors and insulating layers extends substantially perpendicular to the arrangement direction of the at least one mounting face.

8. The support according to claim 1,
   wherein the mounting section comprises at least two mounting faces arranged adjacent to each other.

9. The support according to claim 1, wherein the mounting section comprises at least two mounting faces at an angle to each other.

10. The support according to claim 1, wherein the mounting section comprises at least two mounting faces substantially parallel to each other.

11. The support according to claim 1,
    wherein the mounting section comprises three mounting faces, one of the three mounting faces disposed between the other two of the three mounting faces with an enclosing angle of 45° to 135°.

12. The support according to claim 1, wherein the mounting section comprises three mounting faces, one of the three mounting faces disposed substantially perpendicular to the other two of the three mounting faces.

13. A lighting device comprising:
    a layered structure of alternating conductors and insulating layers, the layered structure comprising a mounting section and a body section adjacent the mounting section,
    the mounting section comprising:
       at least one mounting face that has an arrangement direction, and
       at least three alternating contact sections along the arrangement direction, each contact section electrically coupled to one of the conductors and separated from a neighboring one of the contact sections by one of the insulating layers, and
    the body section having a width that protrudes sidewards from the at least one mounting face and a length that extends substantially parallel to the arrangement direction; and
    at least one light-emitting element mounted along the arrangement direction of the at least one mounting face and electrically coupled to at the least two of the at least three contact sections.

14. The lighting device according to claim 13, further comprising:
    a socket connected to the body section and configured for electrical coupling to a power source.

\* \* \* \* \*